United States Patent [19]

Teramae et al.

[11] Patent Number: 5,708,299
[45] Date of Patent: *Jan. 13, 1998

[54] MULTICHIP PRESS-CONTACT TYPE SEMICONDUCTOR DEVICE

[75] Inventors: Satoshi Teramae, Chiba; Michiaki Hiyoshi, Yokohama, both of Japan

[73] Assignee: Kabushiki Kaisha Toshiba, Kawasaki, Japan

[*] Notice: The term of this patent shall not extend beyond the expiration date of Pat. No. 5,610,439.

[21] Appl. No.: 656,868

[22] Filed: May 30, 1996

[30] Foreign Application Priority Data

May 31, 1985 [JP] Japan ................... 7-134451

[51] Int. Cl.⁶ .................. H01L 29/74; H01L 23/42; H01L 23/48
[52] U.S. Cl. .................. 257/727; 257/181; 257/688; 257/719; 257/785; 257/723
[58] Field of Search .................. 257/727, 717, 257/688, 785, 633, 177–179, 181, 182, 161, 730, 723, 718

[56] References Cited

U.S. PATENT DOCUMENTS

| | | | |
|---|---|---|---|
| 4,918,514 | 4/1990 | Matsuda et al. | 257/182 |
| 4,958,215 | 9/1990 | Kojima et al. | 257/182 |
| 4,996,586 | 2/1991 | Matsuda et al. | 257/726 |
| 5,140,406 | 8/1992 | Matsuda et al. | 257/730 |
| 5,221,851 | 6/1993 | Gobrecht et al. | 257/695 |
| 5,250,821 | 10/1993 | Ferla et al. | 257/177 |
| 5,360,984 | 11/1994 | Kirihata | 257/161 |
| 5,360,985 | 11/1994 | Hiyoshi et al. | 257/181 |
| 5,459,356 | 10/1995 | Schulze et al. | 257/773 |
| 5,469,103 | 11/1995 | Shigekane | 257/471 |
| 5,519,231 | 5/1996 | Nakashima et al. | 257/181 |

*Primary Examiner*—Wael Fahmy
*Assistant Examiner*—Alexander Oscar Williams
*Attorney, Agent, or Firm*—Oblon, Spivak, McClelland, Maier & Neustadt, P.C.

[57] ABSTRACT

IGBT chips and FRD chips are arranged on the same plane so as to be press-contacted by an emitter press-contact electrode plate and a collector press-contact electrode plate at the same time. The FRD chips are arranged at a central portion, and the IGBT chips are arranged at the peripheral portion of the FRD chips. A resin substrate having an opening in its contact portion between a main surface of each of said chip and the emitter press-contact electrode plate is provided between both press-contact electrode plates. Gate press-contact electrodes are formed on the resin substrate to be electrically connected to a gate electrode of each of the IGBT chips. Also, gate wires are fixed to the resin substrate to supply a control signal for controlling the IGBT chips to the gate electrode of the IGBT chips from the gate wires through the gate press-contact electrode.

37 Claims, 10 Drawing Sheets

MULTICHIP PRESS-CONTACT TYPE SEMICONDUCTOR DEVICE

BACKGROUND OF THE INVENTION

1. Field of the Invention

The present invention relates to a multichip press-contact type semiconductor device, which is used in a state that a plurality of semiconductor chips each having a control electrode are pressure contacted each other at the same time.

2. Description of the Related Art

Conventionally, there has been known the press-contact type semiconductor device having the structure in which a single semiconductor chip is sandwiched between press-contact electrode plates. For example, such a kind of the press-contact type semiconductor device is described in U.S. Pat. No. 4,996,586 Matsuda et al. "CRIMP-TYPE SEMICONDUCTOR DEVICE HAVING NON-ALLOY STRUCTURE."

However, in the above-mentioned conventional press-contact type semiconductor device, the chip size must be enlarged in order to increase a rated current. Due to this, there is a problem in that there is high possibility that defectives, which is impossible to be recovered, will be generated in enhancing a driving ability, and a manufacture yield is reduced.

SUMMARY OF THE INVENTION

A first object of the present invention is to provide a press-contact type semiconductor device which can easily enhance a driving ability and which can distribute to improvement of a manufacture yield.

A second object of the present invention is to provide a press-contact type semiconductor device, which can prevent breakage of a gate wire or a shortcircuit due to vibration at the time of transportation in a case of using the structure in which the plurality of semiconductor chips are pressure-contacted, thereby improving reliability.

A third object of the present invention is to provide a press-contact type semiconductor device, which can easily structure an intelligent power module in the structure in which the plurality of semiconductor chips are pressure-contacted.

A fourth object of the present invention is to provide a press-contact type semiconductor device, which can prevent an erroneous press-contact, which is caused by a positional shift of the semiconductor chip due to vibration at the time of transportation in a case of using the structure in which the plurality of semiconductor chips are pressure-contacted.

The first object object can be achieved by a press-contact type semiconductor device comprising a plurality of semiconductor chips, each having a control electrode, arranged on the same plane; first and second press-contact electrode plates for press-contacting the plurality of semiconductor chips at the same time; an insulation substrate, formed between the first and second press-contact electrode plates, having openings at a contact portion between a main surface of each of the semiconductor chips and the first press-contact electrode plate; press-contact electrodes provided on the insulation substrate to be electrically connected to the control electrode of each of the semiconductor chips; and control wires, fixed to the insulation substrate, for supplying a control signal for controlling the respective semiconductor chips to the control electrode of each of the semiconductor chip through the press-contact electrodes.

According to the above-mentioned structure, the plurality of semiconductor chips are press-contacted by the first and second press-contact electrode plates. Then, in order to increase a rated current, the number of semiconductor chips may be increased, so that a driving capability can be easily enhanced. Also, since a large number of small-sized semiconductor chips are formed, and only good chips may be selected to be used, the manufacture yield can be improved. Moreover, the control wires are fixed to the insulation substrate. Due to this, even if the large number of control wires are formed in the structure, which press-contacts the plurality of semiconductor chips, there can be obtained the device, which is strong against vibration, and which has high reliability of the control wires.

The second object object can be achieved by a press-contact type semiconductor device comprising a first group of semiconductor chips arranged on the same plane; a second group of semiconductor chips, each having a control electrode, arranged around the first group of semiconductor chips to be on the same plane as the first group of semiconductor chips; first and second press-contact electrode plates for press-contacting the first and second groups of semiconductor chips at the same time; an insulation substrate, formed between the first and second press-contact electrode plates, having openings at a contact portion between a main surface of each of the semiconductor chips of the first and second groups of semiconductor chips and the first press-contact electrode plate; press-contact electrodes provided on the insulation substrate to be electrically connected to the control electrode of each of the second group of semiconductor chips; and control wires, fixed to the insulation substrate, for supplying a control signal for controlling the second group of semiconductor chips to the control electrode of the second group of semiconductor chips through the press-contact electrodes.

According to the above-mentioned structure, the plurality of semiconductor chips are press-contacted by the first and second press-contact electrode plates. Then, in order to increase a rated current, the number of semiconductor chips may be increased, so that a driving capability can be easily enhanced. Also, since a large number of small-sized semiconductor chips are formed, and only good chips may be selected to be used, the manufacture yield can be improved. Moreover, the control wires are fixed to the insulation substrate. Due to this, even if the large number of control wires are formed in the structure, which press-contacts the plurality of semiconductor chips, there can be obtained the device, which is strong against vibration, and which has high reliability of the control wires. Furthermore, since the second group of semiconductor chips each having the control electrode in its peripheral portion, the press-contact electrodes can be easily formed on the insulation substrate. Also, since the length of each of the control wires can be shortened, the wiring can be easily provided, and there can be reduced the possibility that the breakage and the shortcircuit of the wires will occur, thereby improving reliability.

The third object object can be achieved by a press-contact type semiconductor device comprising: a plurality of semiconductor chips, each having a control electrode, arranged on the same plane; first and second press-contact electrode plates for press-contacting the plurality of semiconductor chips at the same time; an insulation substrate, formed between the first and second press-contact electrode plates, having openings at a contact portion between a main surface of each of the semiconductor chips and the first press-contact electrode plate; press-contact electrodes provided on the insulation substrate to be electrically connected to the control electrode of each of the semiconductor chips; control wires, fixed to the insulation substrate, for supplying a control signal for controlling the respective semiconductor chips to the control electrode of each of the semiconductor chip through the press-contact electrodes; and at least one of a resistor for preventing oscillation to be mounted on the insulation substrate, a thermistor for detecting temperature, a current detecting element for detecting an overcurrent, an overcurrent detecting circuit, and a protection circuit for protecting the respective semiconductor chips.

According to the above-mentioned structure, the plurality of semiconductor chips are press-contacted by the first and second press-contact electrode plates. Then, in order to increase a rated current, the number of semiconductor chips may be increased, so that a driving capability can be easily enhanced. Also, since a large number of small-sized semiconductor chips are formed, and only good chips may be selected to be used, the manufacture yield can be improved. Moreover, at least one of the resistor for preventing oscillation, the thermistor for detecting temperature, the current detecting element for detecting the overcurrent, the overcurrent detecting circuit, and the protection circuit for protecting the semiconductor chips is mounted on the insulation substrate. Due to this, the intelligent power module can be easily structured. Since the above-mentioned elements and circuits are mounted on the insulation substrate, there can be obtained the device, which is strong against vibration, and which has high reliability.

The fourth object object can be achieved by a press-contact type semiconductor device comprising a plurality of semiconductor chips arranged on the same plane; an insulation frame, provided in the main surface of each of the plurality of semiconductor chips, having openings at positions corresponding to the respective semiconductor chips; a disk type heat buffer plate provided on a rear surface of the semiconductor chips; and first and second press-contact electrode plates for press-contacting the plurality of semiconductor chips at the same time, wherein the insulation frame and the disk type heat buffer plate sandwich the respective semiconductor chips from upper and lower directions, thereby positioning and fixing the respective semiconductor chips.

According to the above-mentioned structure, the plurality of semiconductor chips are press-contacted by the first and second press-contact electrode plates. Then, in order to increase a rated current, the number of semiconductor chips may be increased, so that a driving capability can be easily enhanced. Also, since a large number of small-sized semiconductor chips are formed, and only good chips may be selected to be used, the manufacture yield can be improved. Moreover, the respective semiconductor chips are sandwiched by the insulation frame and the disk type heat buffer plate from the upper and lower directions, thereby positioning and fixing the semiconductor chips. Due to this, the positional shift of each of the chips, which is caused by vibration at the time of transportation, can be prevented, and the defectives due to the erroneous press-contact can be prevented, thereby improving reliability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
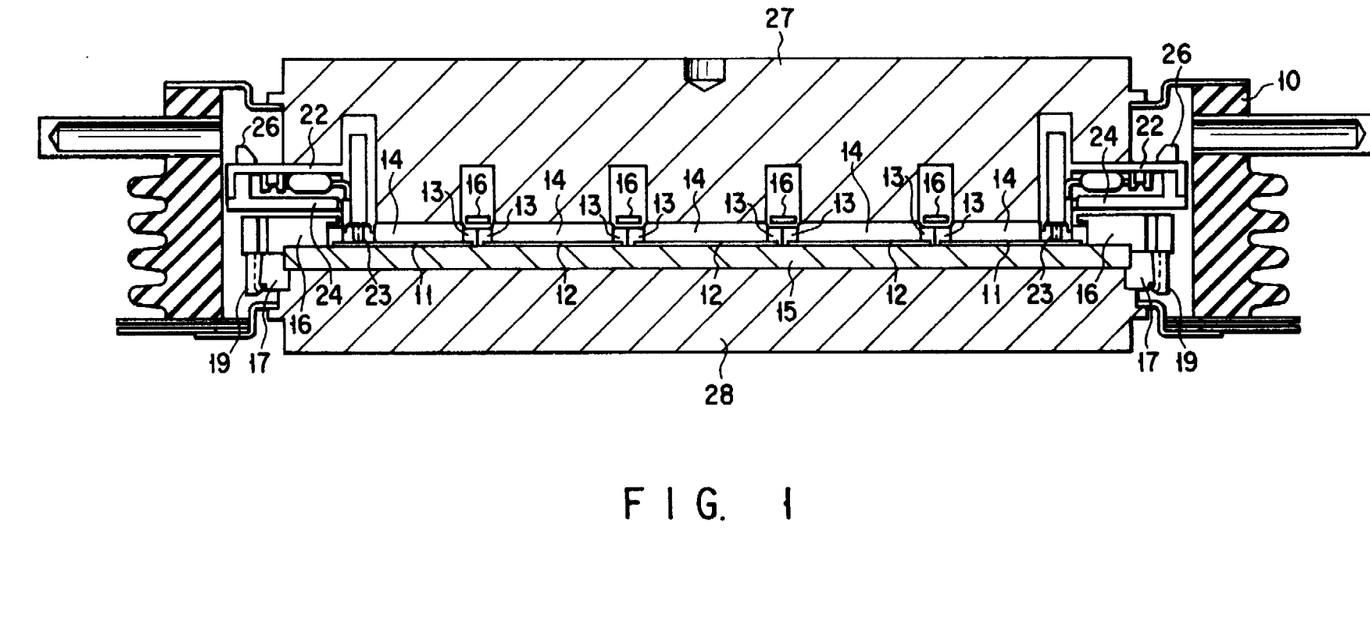
FIG. 1 is a cross sectional view of a press-contact type semiconductor device of a first embodiment of the present invention.
Figure 2:
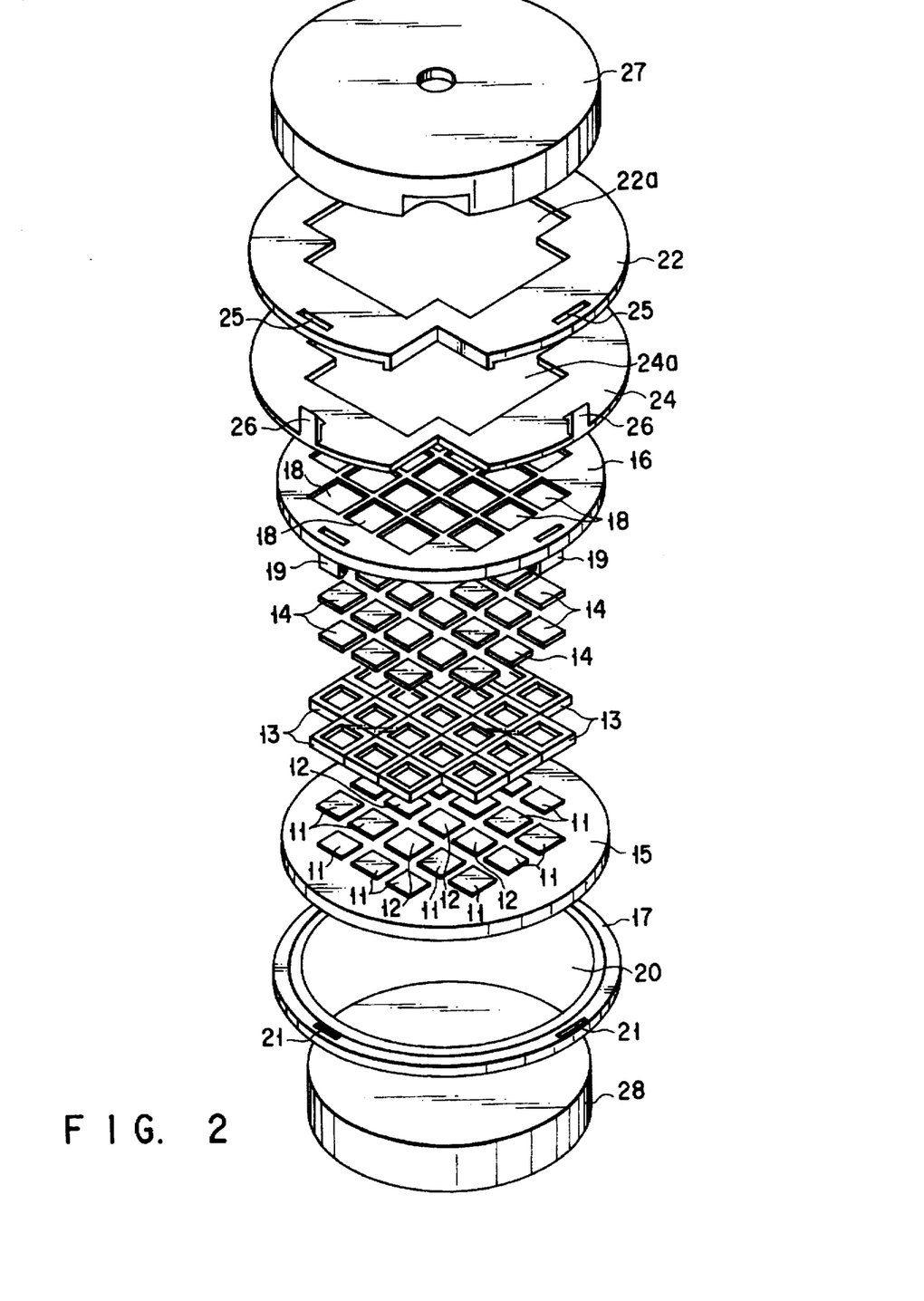
FIG. 2 is an exploded view showing a main part of the press-contact type semiconductor device of FIG. 1 when the press-contact type semiconductor device of FIG. 1 is extracted from an envelope, and exploded.

FIG. 1 is a cross sectional view of a press-contact type semiconductor apparatus of a first embodiment of the present invention. FIG. 2 is an exploded view showing a main part of the press-contact type semiconductor device of FIG. 1 when the press-contact type semiconductor device of FIG. 1 is extracted from an envelope, and exploded. In the first embodiment, there is provided a multichip press-contact type semiconductor apparatus, which is formed by press-contacting a plurality of press-contact type IGBT (Insulating Gate Bipolar Transistor) chips and a plurality of FRD (Fast recovery Diode) connected to the IGBT chips in parallel such that their current flowing directions are opposite to each other.

An envelope (or casing) 10 is formed of, for example, ceramics. Regarding the IGBT chips 11, 11, . . . , and FRD chips 12, 12, . . . , the four sides of their main surface sides are fixed by chip frames 13, 13, . . . so as to prevent their position from being shifted in a horizontal direction. These chip frames 13, which are formed of silicone resin or polyethermide, are fixed to corner sections of four sides of the respective chips 11 and 12 with adhesion. Heat buffer plates (emitter side heat buffer plates ) 14, 14, . . . are formed of a molybdenum plate whose thickness is 1 to 2 mm. The four corners of each of the heat buffer buffers 14 are formed to have a radius of curvature of 0.2 to 1.0 mm in order to prevent a load from being concentrated on the corners of each of the chips 11, 12. A disk type heat buffer plate (collector side heat buffer plate) 15 is formed on a rear side of each of the chips 11, 12. Openings 18, 18, . . . are formed at a central section of a resin frame 16 so as to correspond to the positions of the respective chips 11, 12, thereby forming a lattice frame is formed. Then, claws 19, 19, . . . are formed on an outer peripheral portion. On the other hand, an opening 20 is formed in a ring frame 17 so as to correspond to the disk type heat buffer plate 15. Engaging holes 21, 21, . . . are formed at positions corresponding to the claws 19. The claws 19 of the resin frame 16 and the engaging holes 21 of the ring frame 17 are engaged with each other. In other words, the heat buffer plates 14, chip frames 13, IGBT chips 11, FRD chips 12, and the disk type heat buffer plate 15 are sandwiched between the resin frame 16 and the ring frame 17.

Moreover, in a frame-like resin substrate 22, an opening 22a is formed to correspond to the arrangement of the respective chips 11, 12. On a rear surface of the resin substrate 22, gate wires are formed at positions corresponding to gate electrodes of the respective IGBT chips 11 so as to supply a control signal to the gate electrodes of the respective IGBT chips 11, through gate press-contact electrodes 23, 23, . . . The gate press-contact electrodes 23 are press-contacted the electrode of the IGBT chips 11 by a spring (not shown). The gate wires 29 are fixed to the resin substrate 22, and protected by a resin-made protection cover 24 having an opening 24a corresponding to the shape of the opening 22a. In other words, engaging holes 25, 25, . . . are formed in the outer peripheral portion of the resin substrate 22. Claws 26, 26 . . . are formed at positions corresponding to the engaging holes 25 of the protection cover 24. Then, the claws 26 are engaged with the engaging holes 25, thereby the gate wires are protected.

Emitter press-contact electrode 27 and a collector press-contact electrode 28 are formed so as to sandwich the chips 11, 12, chip frames 13, heat buffer plates 14, disk type heat buffer plate 15, insulation frame 16, ring frame 17, protection cover 24, and insulation substrate 22 therebetween. On the rear surface of the emitter press-contact electrode plate 27, columnar projecting portions are formed at the positions corresponding to the respective IGBT chips 11 and FRD chips 12. The projecting portions press-contact the main surface of each of the chips 11, 12 through the opening 22a of the resin substrate 22, the opening 24a of the projection cover 24, the openings 18 of the resin frame 16, the heat buffer plates 14, and the chip frames 13. Then, the projection sections are used in a state that high pressure is applied onto the emitter press-contact electrode plate 27, and the collector press-contact plate 28.

Figure 3:
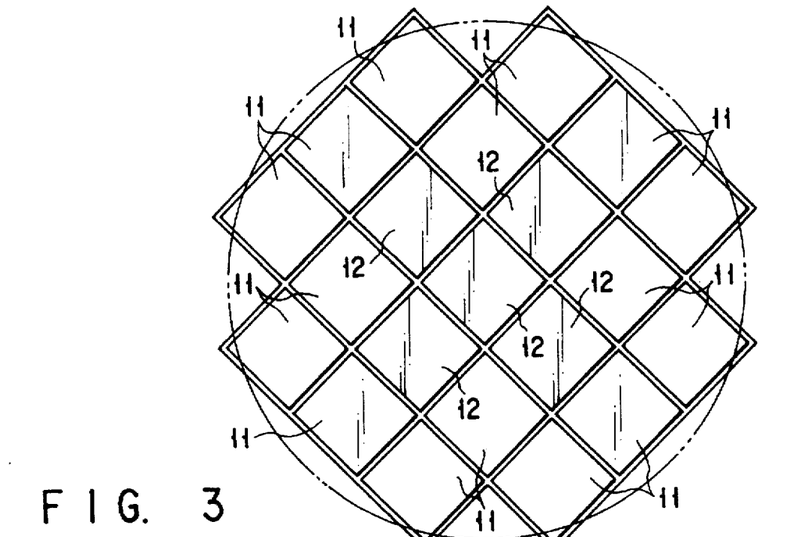
FIG. 3 is a plane view showing the position of each of semiconductor chips of FIGS. 1 and 2.
Figure 4:
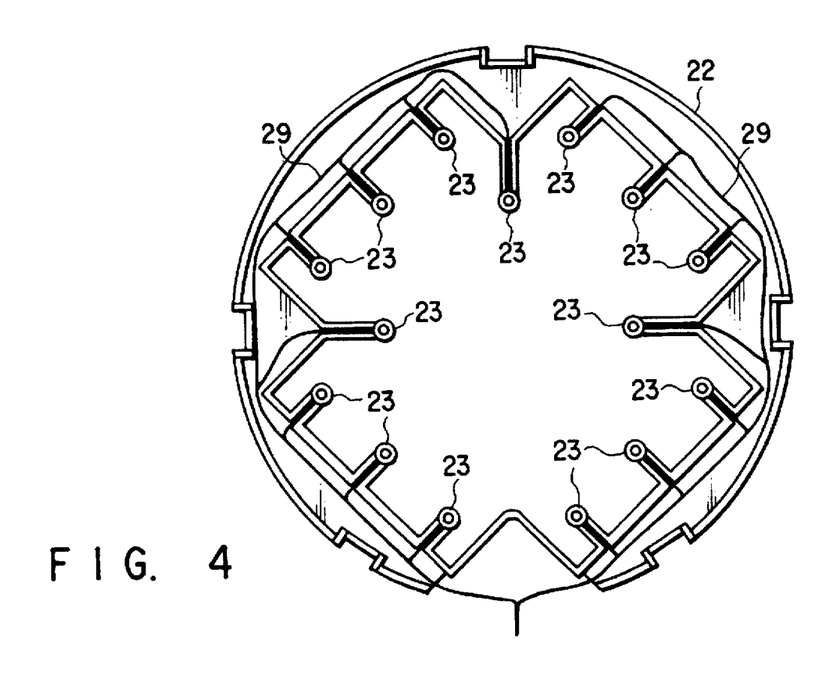
FIG. 4 is a plane view of a resin substrate of FIGS. 1 and 2, seen from a rear face.

FIG. 3 is a plane view showing the arrangement of the respective chips of FIGS. 1 and 2. As shown in the figure, FRD chips 12 are arranged at the central portion, and IGBT chips 11 are arranged at the peripheral portion to surround the FRD chips 12. The FRD chips 12 are connected to IGBT chips 11 in parallel such that their current flowing directions are opposite to each other. FIG. 4 is a plane view of the resin substrate 22 of FIGS. 1 and 2, seen from the rear surface. On the resin substrate, the gate press-contact electrodes 23 are provided at positions corresponding to the gate electrodes of the respective IGBT chips 11. Then, gates wires 29 are connected to these gate press-contact electrodes 23. The gate wires 29 are stranded at one portion to be led to an outer section. Then, the control signal is input from the gate wires 29 to be supplied to the gate electrodes of the respective IGBT chips 11 through the gate press-contact electrodes 23, thereby on/off control is executed.

Figure 5A:
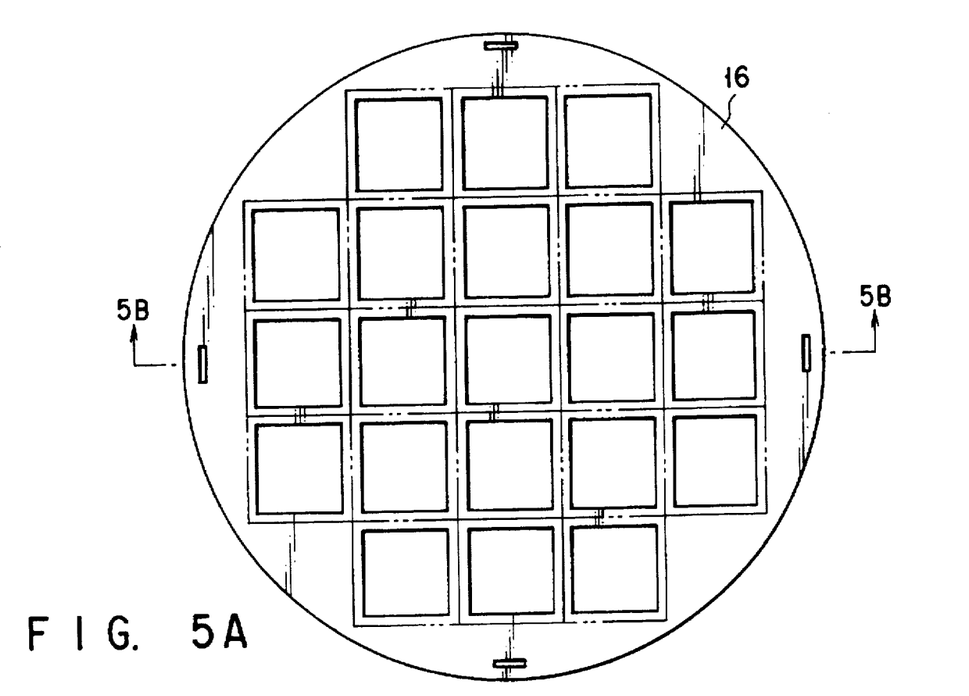
FIG. 5A is a plane view explaining a resin frame of FIGS. 1 and 2.
Figure 5B:
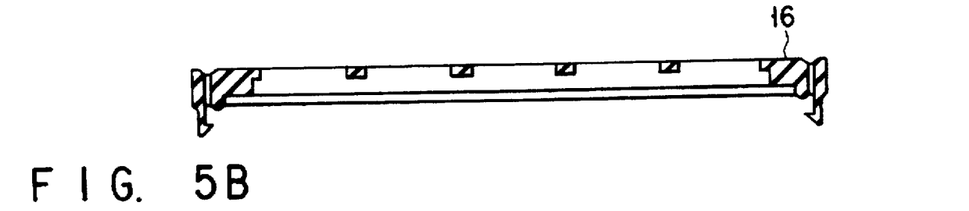
FIG. 5B is a cross sectional view taken along a line of 5B—5B of FIG. 5A.
Figure 5C:
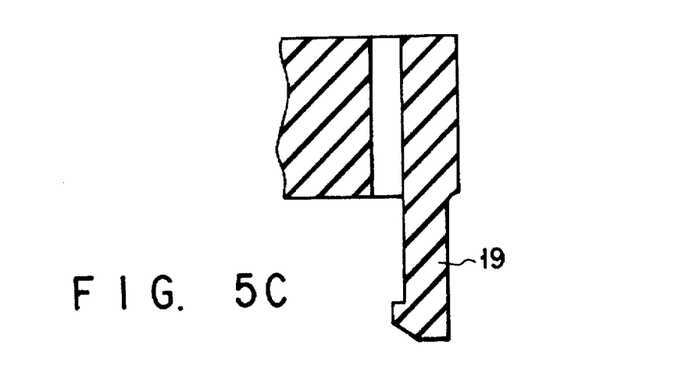
FIG. 5C is a cross sectional view showing an enlarged end portion of FIG. 5B.

FIG. 5A is a plane view of the resin frame 16 of FIGS. 1 and 2, FIG. 5B is a cross sectional view taken along a line of 5B—5B of the resin frame 16 of FIG. 5A, FIG. 5C are a cross sectional view showing an enlarged end portion of the resin frame 16 of FIG. 5B. As shown in FIG. 5A, the lattice frame is formed at a boundary position between the IGBT chips 11 and the FRD chips 12 shown by a two-dot chain line. Then, these chips 11, 12 are pressurized by the resin frame 16 from an upper direction to be held.

According to the above-mentioned structure, the plurality of IGBT chips 11 are press-contacted in a state that high pressure is applied onto the emitter press-contact electrode plate 27, and the collector press-contact plate 28. Due to this, the number of chips 11 may be increased in order to increase the rated current. As a result, the driving capability can be easily enhanced. Also, since a large number of small-sized IGBT chips 11 are formed, and only good chips may be selected to be used, the manufacture yield can be improved. Moreover, since the gate electrode wires 29 are fixed to the resin substrate 22, there is little possibility that the gate electrode wire will be short-circuited or broken due to vibration at the time of transportation. Thereby, reliability of the gate electrode wires 29 can be improved. Furthermore, since the IGBT chips 11 are arranged at the peripheral portion, the gate press-contact electrodes 23 can be easily formed on the resin substrate 22, and the length of each of the gate electrode wires 29 can be reduced. Due to this, the wires can be easily arranged, and there can reduced possibility that the breakage and the shortcircuit will occur. In view of these points, reliability can be improved. Moreover, since the length of each of the gate electrodes wires 29, 29, . . . can be reduced, reduction of inductance components can be improved. Furthermore, the heat buffer plates 14, chip frames 13, IGBT chips 11, FRD chips 12, and the disk type heat buffer plate 15 are sandwiched between the resin frame 16 and the ring frame 17 from the upper and lower directions, thereby positioning and fixing the respective chips 11, 12 in the upper and lower directions. As a result, there can be prevented the positional shift of the chips due to vibration at the time of transportation, i.e., no pressure is applied to the press-contact electrodes 27 and 28. Moreover, there can be prevented defectives, which are generated by the erroneous press-contact, such as the breakage of the chip, and the shortcircuit between the chips, which are generated when high pressure is applied to the emitter press-contact electrode plate 27 and the collector press-contact electrode plate 28 in a state that the position of the chip is shifted. Thereby, reliability can be improved.

Figure 6:
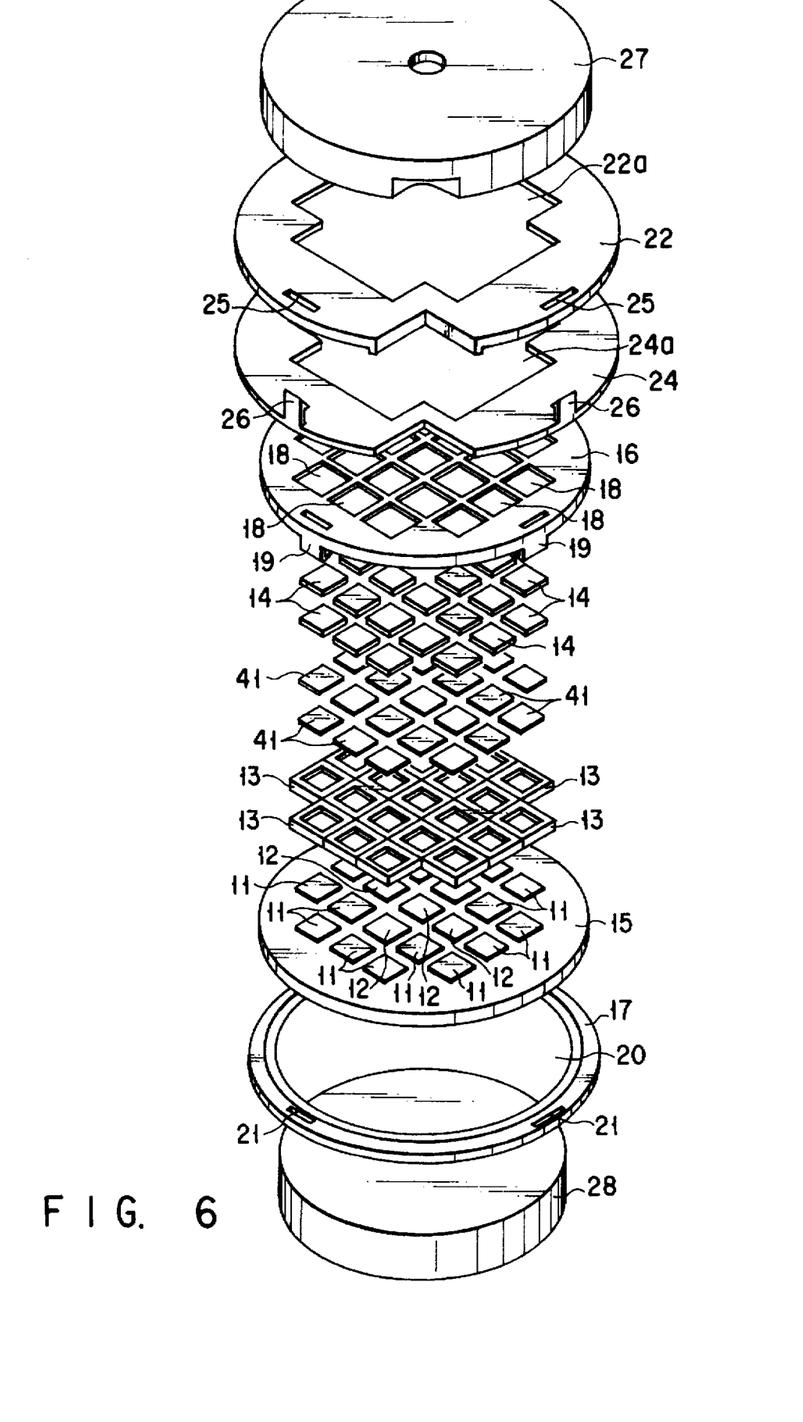
FIG. 6 is an exploded view explaining a press-contact type semiconductor device of a second embodiment of the present invention in order to show a main part of the press-contact type semiconductor device when the press-contact type semiconductor device is extracted from an envelope, and exploded.

FIG. 6 is an exploded view explaining a press-contact type semiconductor device of a second embodiment of the present invention in order to show a main part of the press-contact type semiconductor device when the press-contact type semiconductor device is extracted from the envelope, and exploded. In the first embodiment, the heat buffer plates 14 are arranged on the respective chips 11, 12. In the second embodiment, soft metallic foil 41 having low resistance is provided between the chips 11, 12, and the heat buffer plates 14. The foil 41 is formed of Cu.

According to the above-mentioned structure, electrical contact between the chips 11, 12, and the heat buffer plates 14 can be satisfactorily made.

Figure 7:
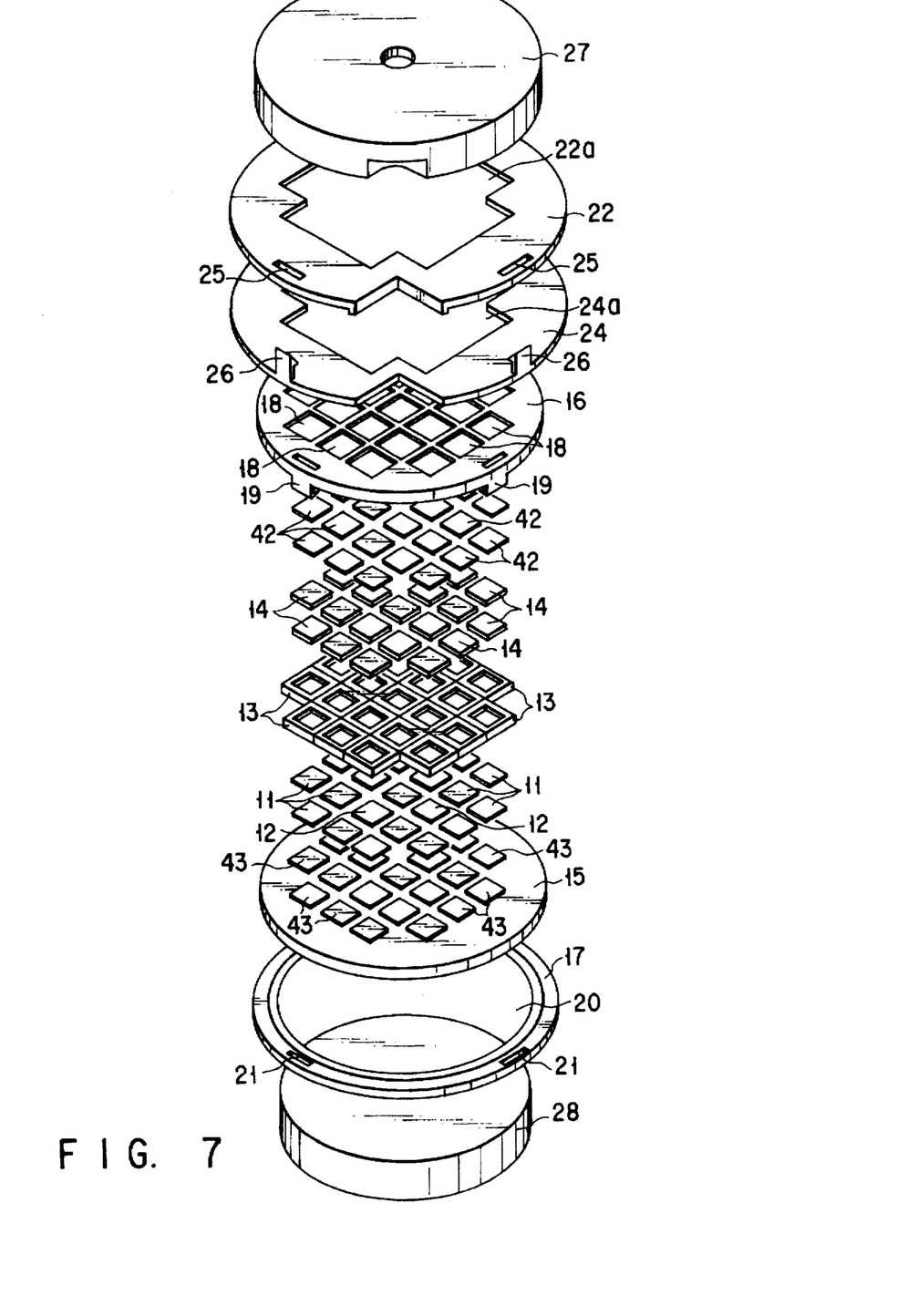
FIG. 7 is an exploded view explaining a press-contact type semiconductor device of a third embodiment of the present invention in order to show a main part of the press-contact type semiconductor device when the press-contact type semiconductor device is extracted from an envelope, and exploded.

FIG. 7 is an exploded view explaining a press-contact type semiconductor device of a third embodiment of the present invention in order to show a main part of the press-contact type semiconductor device when the press-contact type semiconductor device is extracted from the envelope, and exploded.

In the third embodiment, sliver sheets 42 are provided between the emitter press-contact electrode plate 27 and the heat buffer plates 14. Moreover, sliver sheets 43 are provided between the chips 11, 12 and the disk type heat buffer plate 15.

According to the above-mentioned structure of the third embodiment, by use of the sliver sheets 42 and 43, there can be absorbed variations of pressure, which are generated by the differences in the thickness of the respective chips 11, 12 and the differences in the thickness of the heat buffer plates 14. Due to this, equal pressure can be applied to the respective chips 11, 12 at the time of the press-contact.

It is noted that either sliver sheets 42 or sliver sheets 43 may be provided as required.

Figure 8:
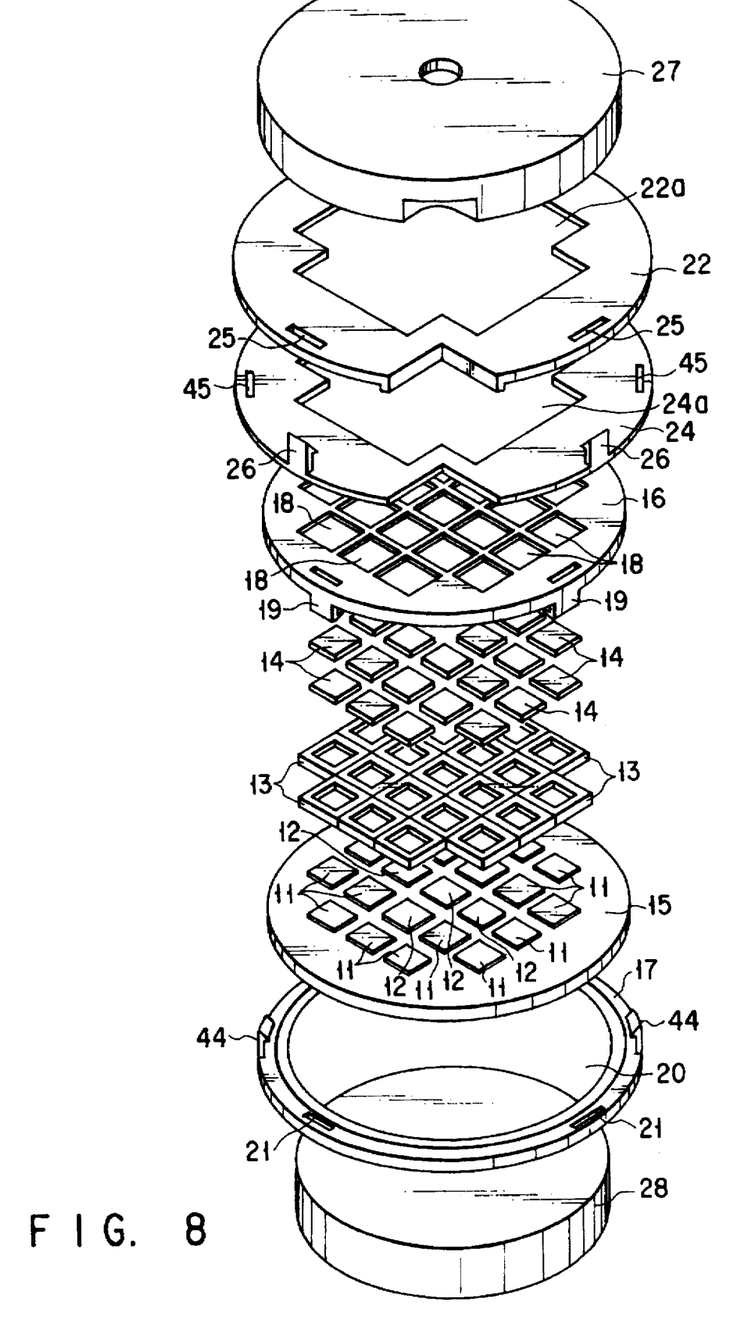
FIG. 8 is an exploded view explaining a press-contact type semiconductor device of a fourth embodiment of the present invention in order to show a main part of the press-contact type semiconductor device when the press-contact type semiconductor device is extracted from an envelope, and exploded.

FIG. 8 is an exploded view explaining a press-contact type semiconductor device of a fourth embodiment of the present invention in order to show a main part of the press-contact type semiconductor device when the press-contact type semiconductor device is extracted from the envelope, and exploded. In the first embodiment, the resin frame 16 and the ring frame 17 were engaged with each other, and the resin substrate 22 and the projection cover 24 were engaged with each other. In the fourth embodiment, claws 44 are formed in the ring frame 17, and engaging holes 45 are formed at a position corresponding to the protection cover 24. Then, the claws 44 are engaged with the engaging holes.

According to the above-mentioned structure of the fourth embodiment, the resin substrate 22 and the protection cover 24 are engaged with each other. Also, the resin frame 16 and the ring frame 17 are engaged with other. Moreover, the protection cover 24 and the ring frame 17 are engaged with other. As a result, the resin substrate 22, the protection cover 24, the resin frame 16, the heat buffer plates 14, the chip frames 13, the FRD chips 12, the IGBT chips 11, the disk type heat buffer plate 15, and the ring frame 17 are sandwiched between the emitter press-contact electrode plate 27 and the collector press-contact electrode plate 28 so as to be formed as one unit. The above-mentioned structure becomes strong against vibration, which is caused at the time of transportation.

Similarly, it is possible to form claws in one of the resin frame 16 and the resin substrate 22 and engaging holes in the other so as to engage the resin frame 16 with the resin substrate 22.

Figure 9A:
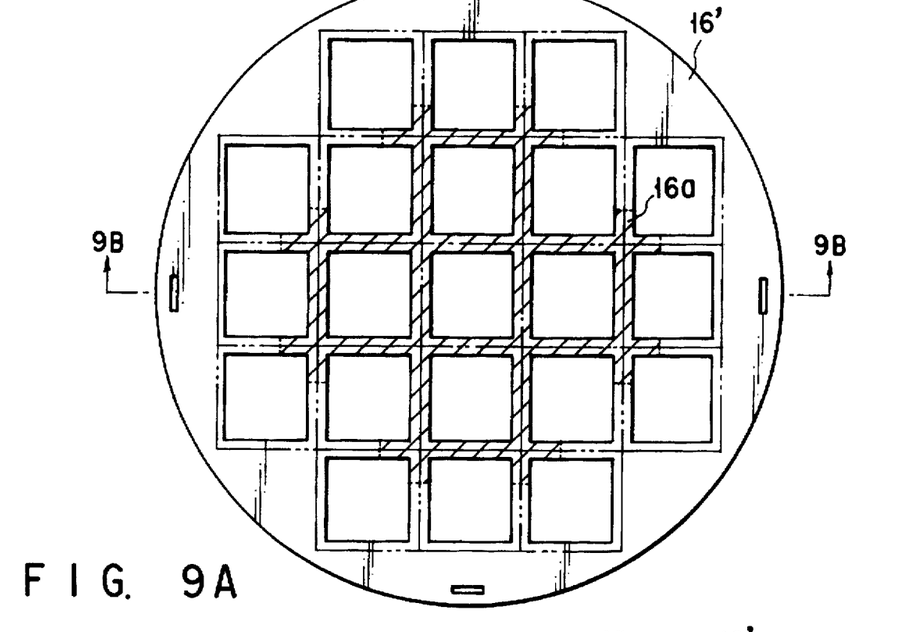
FIG. 9A is a plane view explaining a press-contact type semiconductor device of a fifth embodiment of the present invention in order to show the other structure of the resin frame.
Figure 9B:
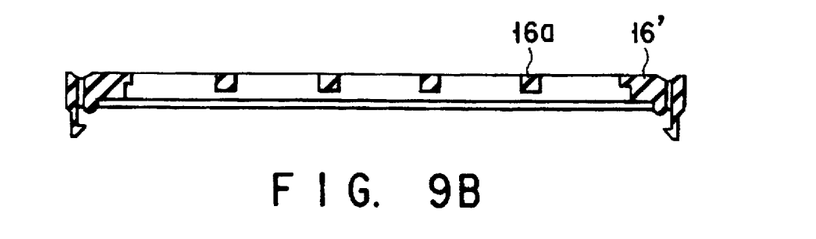
FIG. 9B is a cross sectional view taken along a line 9B—9B of FIG. 9A.

FIG. 9A is a plane view explaining a press-contact type semiconductor device of a fifth embodiment of the present invention in order to show the other structure of the resin frame. FIG. 9B is a cross sectional view taken along a line 9B—9B of FIG. 9A. A resin frame 16' of FIGS. 9A and 9B is basically the same as the resin frame 16 of FIGS. 5A to 5C. However, a region 16a of the lattice frame to which hatching is added is formed to be thicker than the other peripheral regions.

According to the above-mentioned structure of the fifth embodiment, when vibration is applied at the time of transportation, the region 16a serves as a stopper in a horizontal direction to effectively prevent the positional shift of the chips, so that the generation of defectives due to erroneous press-contact can be prevented, and reliability can be improved.

Figure 10:
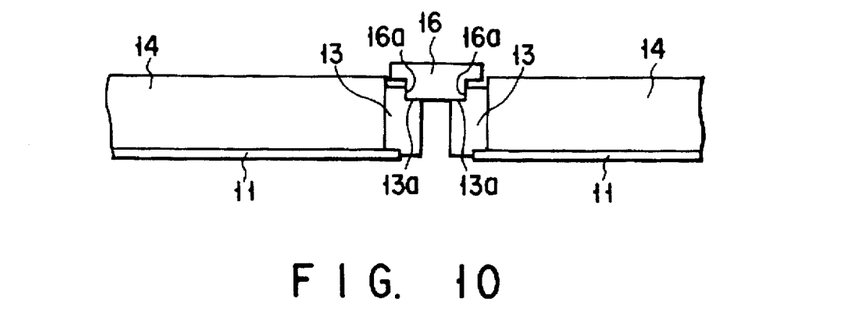
FIG. 10 is a cross sectional view explaining a press-contact type semiconductor device of a sixth embodiment of the present invention in order to show IGBT chips, chip frames, heat buffer plates, and a portion close to a bonded portion of the resin frame in an enlarged manner.

FIG. 10 is a cross sectional view explaining a press-contact type semiconductor device of a sixth embodiment of the present invention in order to show IGBT chips 11 (FRD chips 12), chip frames 13, heat buffer plates 14, and a portion close to a bonded portion of resin frame 16. More specifically, notch portions 13a, 13a, . . . are formed in an outer peripheral portion of the chip frames 13. Projecting sections 16a, 16a, . . . are formed in the resin frame 16 to correspond to contact portions with the chip frames 13. Then, the chip frames 13 and the resin frame 16 are engaged with each other, thereby positioning and fixing the respective chips 11, 12 in the upper and lower directions. In addition, each chip can be positioned in a horizontal direction.

According to the above-mentioned structure of the sixth embodiment, the chips can be positioned in the upper and lower directions and the horizontal direction to be fixed. Due to this, there can be prevented the positional shift of the chips due to vibration at the time of transportation, i.e., no pressure is applied to the press-contact electrodes 27 and 28. Moreover, there can be surely prevented defectives, which are generated by the erroneous press-contact.

Figure 11:
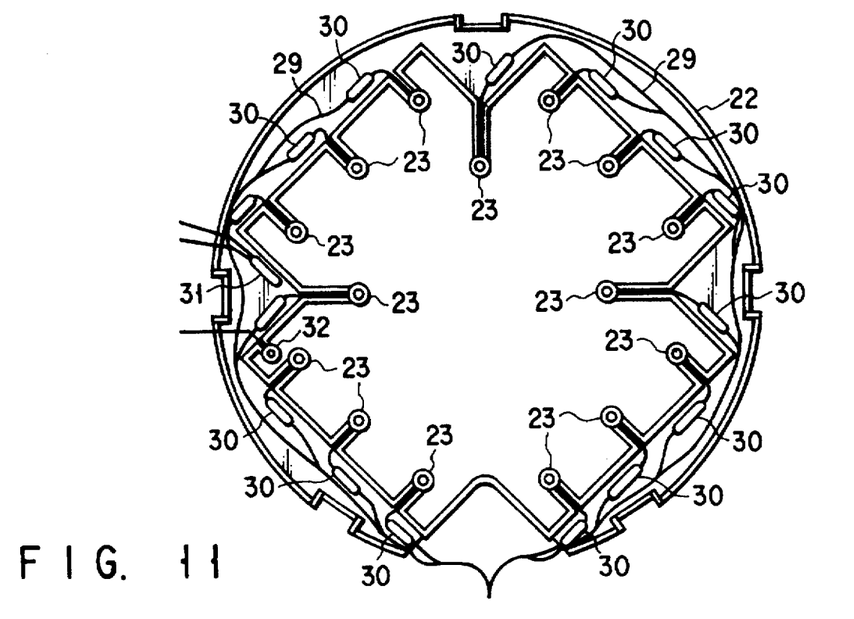
FIG. 11 is a plane view explaining a press-contact type semiconductor device of a seventh embodiment of the present invention in order to show the other structure of the resin substrate.

FIG. 11 is a plane view explaining a press-contact type semiconductor device of a seventh embodiment of the present invention. More specifically, resistors 30, 30, . . . , a thermistor 31, and a current detecting element 32 are formed on the resin substrate 22. The resistors 30 are gate resistors, which are provided between the gate wires 29 and the gate press-contact electrodes 23 for preventing IGBT chips from being oscillated. The thermistor 31 is used to check temperature of the press-contact semiconductor device to prevent the temperature from being increasing to abnormally high. The thermistor 31 is connected to a temperature detecting circuit, which is provided to an outer unit. The current detecting element 32 is used to check a current flowing to IGBT chips 11 to prevent a flow of an overcurrent. The current detecting element 32 is connected to an overcurrent detecting circuit, which is provided to an outer unit.

According to the above-mentioned structure of the seventh embodiment, since various elements can be mounted on the resin substrate 22, the intelligent power module can be easily structured. Also, there can be obtain high resistance to vibration.

Figure 12:
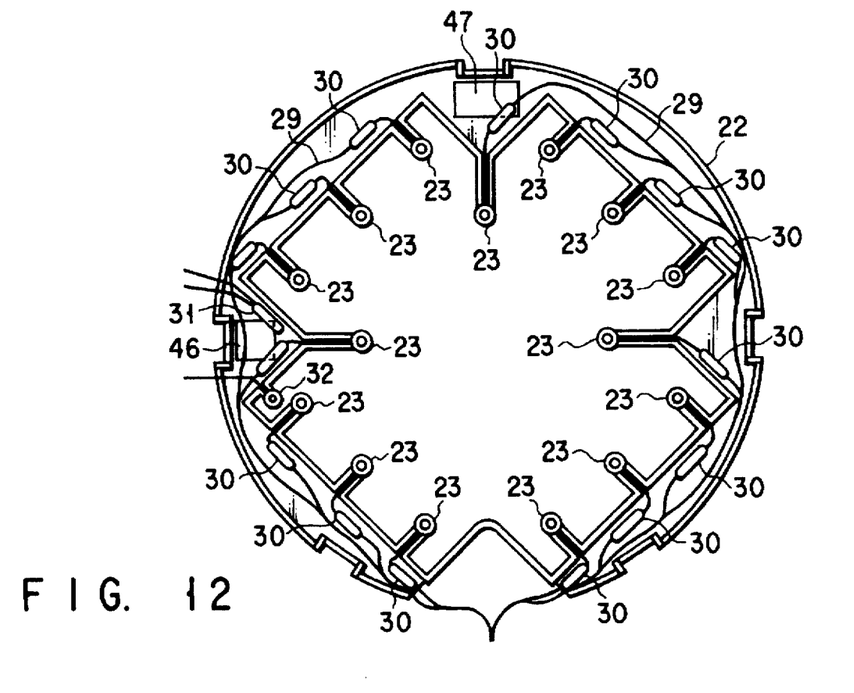
FIG. 12 is a plane view explaining a press-contact type semiconductor device of an eighth embodiment of the present invention in order to further show the other structure of the resin substrate.

It is noted that a Zener diode having about 30 V may be connected between the gate of IGBT and the emitter, or a capacitor may be inserted between the gate and the emitter. These Zener diode and the capacitor are mounted on the resin substrate 22. Moreover, as shown in FIG. 12, it is possible to mount an overcurrent detecting circuit 46, which includes not only the current detecting element 32 but also the other elements, and a protection circuit 47 for protecting IGBT chips 11 thereon.

Figure 13:
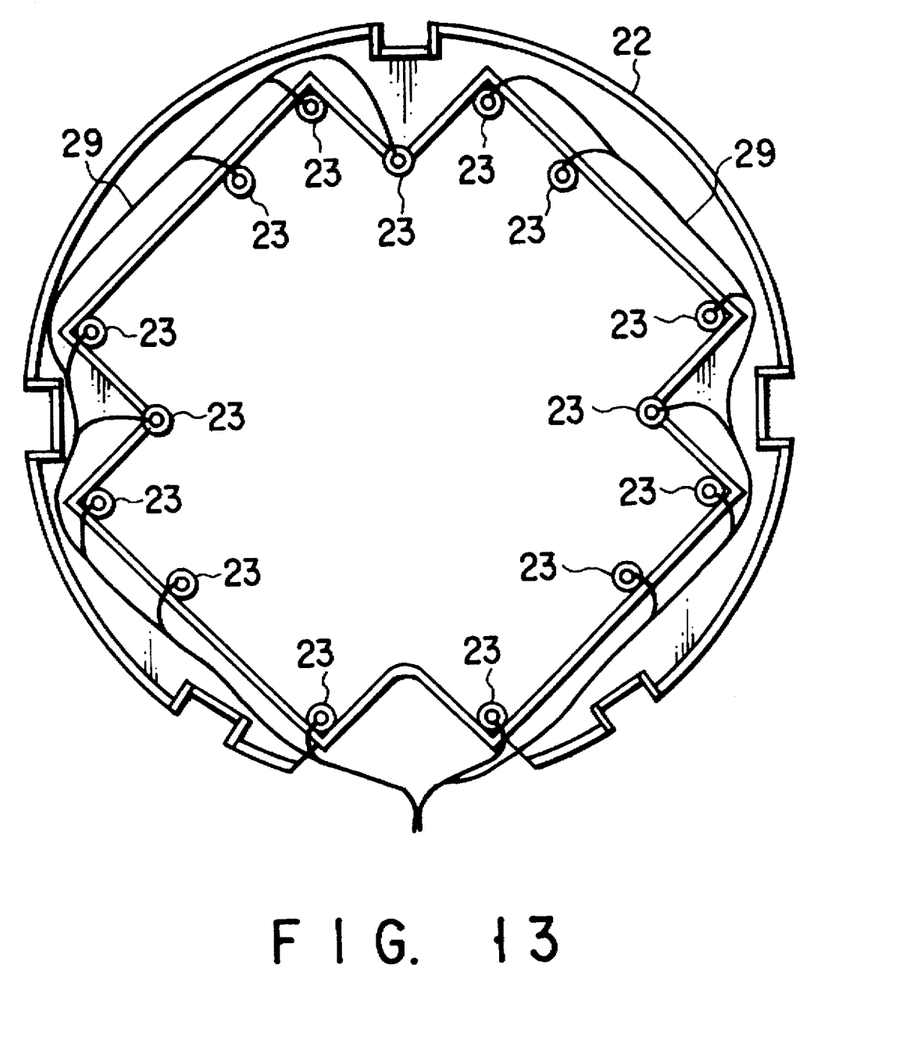
FIG. 13 is a plane view explaining a press-contact type semiconductor device of a ninth embodiment of the present invention in order to show the structure of the resin substrate when being applied to the IGBT chip of a corner gate.

FIG. 13 is a plane view explaining a press-contact type semiconductor device of a ninth embodiment of the present invention. The first to eighth embodiments explained the structure in which the gates are formed at the center of the respective IGBT chips 11. The ninth embodiment shows the structure of the resin substrate 22 in which the gates are provided at the corners of the IGBT chips. In the case of the structure in which the gates are provided at the corners of the IGBT chips, the gate wires 29 can be shortened as compared with the structure in which the gates are formed at the center of the respective IGBT chips. Due to this, the wires can be easily arranged, and there can reduced possibility that the breakage and the shortcircuit will occur. As a result, reliability can be improved. Moreover, reduction of inductance components of the wires 29 can be improved.

The present invention is not limited to the first to ninth embodiment, and various modifications can be made without deviating from the gist of the present invention. For example, the above-mentioned embodiments explained the reverse conducting press-contact type IGBT as one example of the press-contact type semiconductor device. It is of course that the reverse conducting press-contact type IGBT can be applied to the press-contact semiconductor device using the other elements.

As mentioned above, according to the present invention, there can be obtained a press-contact type semiconductor device, which can easily enhance the driving capability, and which can distribute to improvement of the manufacture yield. Also, according to the present invention, there can be provided a press-contact type semiconductor device, which can prevent breakage of a gate wire or a shortcircuit due to vibration at the time of transportation in a case of using the structure in which the plurality of semiconductor chips are pressure-contacted, thereby improving reliability. Moreover, according to the present invention, there can be provided a press-contact type semiconductor device, which can easily structured an intelligent power module in the structure in which the plurality of semiconductor chips are pressure-contacted. Furthermore, according to the present invention, there can be provided a press-contact type semiconductor device, which can prevent an erroneous press-contact, which is caused by a positional shift of the semiconductor chip due to vibration at the time of transportation in a case of using the structure in which the plurality of semiconductor chips are pressure-contacted.

What is claimed is:

1. A press-contact type semiconductor device comprising:
   a plurality of semiconductor chips, each having a control electrode, solderlessly arranged on the same plane;
   first and second press-contact electrode plates for press-contacting said plurality of semiconductor chips at the same time;
   an insulation substrate, formed between said first and second press-contact electrode plates, having openings at a contact portion between a main surface of each of said semiconductor chips and said first press-contact electrode plate;
   press-contact electrodes provided on said insulation substrate to be electrically connected to the control electrode of each of said semiconductor chips; and
   control wires, fixed to said insulation substrate, for supplying a control signal for controlling said respective semiconductor chips to the control electrode of each of said semiconductor chip through said press-contact electrodes.

2. The press-contact type semiconductor device according to claim 1, further comprising a protection cover for protecting the control wires fixed to said insulation substrate.

3. The press-contact type semiconductor device according to claim 1, further comprising a disk type heat buffer plate provided between said plurality of semiconductor chips and said second press-contact electrode plate.

4. The press-contact type semiconductor device according to claim 1, further comprising a plurality of heat buffer plates each provided between the main surface of each of said plurality of semiconductor chip and said first press-contact electrode plate.

5. The press-contact type semiconductor device according to claim 4, further comprising a plurality of sliver sheets each provided between the main surface of each of said plurality of semiconductor chips and said plurality of heat buffer plates.

6. The press-contact type semiconductor device according to claim 1, wherein said plurality of semiconductor chips include FRD chips arranged at a central portion and IGBT chips arranged to surround said FRD chips, and said respective FRD chips are connected to said respective IGBT chips in parallel such that their current flowing directions are opposite to each other.

7. The press-contact type semiconductor device according to claim 1, further comprising chip frames, provided between the main surface of each of said semiconductor chips and said first press-contact electrode plate, for positioning and fixing each of said semiconductor chips in a horizontal direction.

8. The press-contact type semiconductor device according to claim 7, further comprising an insulation frame, provided in the main surface of each of said plurality of semiconductor chips, having openings at positions corresponding to said respective semiconductor chips, wherein said chip frames have notch portions in the outer peripheral portion, said insulation frame has projecting portions to be engaged with the notch portions of said chip frames, said chip frames and said insulation frame are engaged with each other, thereby positioning and fixing each of said semiconductor chips in upper and lower directions.

9. The press-contact type semiconductor device according to claim 1, wherein said first press-contact electrode plate has columnar projecting portions at the positions corresponding to said respective semiconductor chips, and the main surface of each of said semiconductor chips is press-contacted by said projecting portions.

10. A press-contact type semiconductor device comprising:
    a first group of semiconductor chips solderlessly arranged on the same plane;
    a second group of semiconductor chips, each having a control electrode solderlessly, arranged around said first group of semiconductor chips to be on the same plane as said first group of semiconductor chips;
    first and second press-contact electrode plates for press-contacting said first and second groups of semiconductor chips at the same time;
    an insulation substrate, formed between said first and second press-contact electrode plates, having openings at a contact portion between a main surface of each of said semiconductor chips of said first and second groups of semiconductor chips and said first press-contact electrode plate;
    press-contact electrodes provided on said insulation substrate to be electrically connected to the control electrode of each of said second group of semiconductor chips; and control wires, fixed to said insulation substrate, for supplying a control signal for controlling said second group of semiconductor chips to the control electrode of said second group of semiconductor chips through said press-contact electrodes.

11. The press-contact type semiconductor device according to claim 10, further comprising a protection cover for protecting the control wires fixed to said insulation substrate.

12. The press-contact type semiconductor device according to claim 11, wherein said protection cover is engaged with said insulation substrate.

13. The press-contact type semiconductor device according to claim 10, further comprising a disk type heat buffer plate provided between said first and second groups of semiconductor chips and said second press-contact electrode plate.

14. The press-contact type semiconductor device according to claim 13, further comprising a plurality of sliver sheets each provided between the main surface of each of said first and second groups of semiconductor chips and said heat buffer plate.

15. The press-contact type semiconductor device according to claim 10, further comprising a plurality of heat buffer plates each provided between the main surface of each of said first and second groups of semiconductor chips and said first press-contact electrode plate.

16. The press-contact type semiconductor device according to claim 15, further comprising a plurality of sliver sheets each provided between the main surface of each of said first and second groups of semiconductor chips and said plurality of heat buffer plates.

17. The press-contact type semiconductor device according to claim 15, further comprising soft metallic foil having low resistance provided between said plurality of heat buffer plates and said first and second groups of semiconductor chips.

18. The press-contact type semiconductor device according to claim 10, wherein the semiconductor chips of said first group of semiconductor chips are FRD chips, and the semiconductor chips of said second group of semiconductor chips are IGBT chips, and said respective FRD chips are connected to said respective IGBT chips in parallel such that their current flowing directions are opposite to each other.

19. The press-contact type semiconductor device according to claim 10, further comprising chip frames, provided between the main surface of each of said first and second groups of semiconductor chips and said first press-contact electrode plate, for positioning and fixing said first and second groups of semiconductor chips in a horizontal direction.

20. The press-contact type semiconductor device according to claim 19, further comprising an insulation frame, provided in the main surface of each of said first and second groups of semiconductor chips, having openings at positions corresponding to said first and second groups of semiconductor chips, wherein said chip frames have notch portions in the outer peripheral portion, said insulation frame has projecting portions to be engaged with the notch portions of said chip frames, said chip frames and said insulation frame are engaged with each other, thereby positioning and fixing said first and second groups of semiconductor chips in upper and lower directions.

21. The press-contact type semiconductor device according to claim 10, wherein said first press-contact electrode plate has columnar projecting portions at the positions corresponding to said first and second groups of semiconductor chips, and said first and second groups of semiconductor chips is press-contacted by said projecting portions.

22. A press-contact type semiconductor device comprising:

a plurality of semiconductor chips, each having a control electrode solderlessly, arranged on the same plane;

first and second press-contact electrode plates for press-contacting said plurality of semiconductor chips at the same time;

an insulation substrate, formed between said first and second press-contact electrode plates, having openings at a contact portion between a main surface of each of said semiconductor chips and said first press-contact electrode plate;

press-contact electrodes provided on said insulation substrate to be electrically connected to the control electrode of each of said semiconductor chips;

control wires, fixed to said insulation substrate, for supplying a control signal for controlling said respective semiconductor chips to the control electrode of each of said semiconductor chip through said press-contact electrodes; and at least one of a resistor for preventing oscillation to be mounted on said insulation substrate, a thermistor for detecting temperature, a current detecting element for detecting an overcurrent, an overcurrent detecting circuit, and a protection circuit for protecting said respective semiconductor chips.

23. The press-contact type semiconductor device according to claim 22, further comprising a protection cover for protecting said control wires fixed to said insulation substrate and at least one of a resistor for preventing oscillation to be mounted on said insulation substrate, a thermistor for detecting temperature, a current detecting element for detecting an overcurrent, an overcurrent detecting circuit, and a protection circuit for protecting said respective semiconductor chips.

24. The press-contact type semiconductor device according to claim 23, wherein said protection cover is engaged with said insulation substrate.

25. The press-contact type semiconductor device according to claim 22, further comprising a disk type heat buffer plate provided between said plurality of semiconductor chips and said second press-contact electrode plate.

26. The press-contact type semiconductor device according to claim 25, further comprising a plurality of sliver sheets each provided between said plurality of semiconductor chips and said heat buffer plate.

27. The press-contact type semiconductor device according to claim 22, further comprising a plurality of heat buffer plates each provided between the main surface of each of said plurality of semiconductor chips and said first press-contact electrode plate.

28. The press-contact type semiconductor device according to claim 27, further comprising a plurality of sliver sheets each provided between the main surface of each of said plurality of semiconductor chips and said plurality of heat buffer plates.

29. The press-contact type semiconductor device according to claim 27, further comprising soft metallic foil having low resistance provided between said plurality of heat buffer plates and said plurality of semiconductor chips.

30. The press-contact type semiconductor device according to claim 22, wherein said plurality of semiconductor chips include FRD chips arranged at a central portion and IGBT chips arranged to surround said FRD chips, and said respective FRD chips are connected to said respective IGBT chips in parallel such that their current flowing directions are opposite to each other.

31. The press-contact type semiconductor device according to claim 22, further comprising chip frames, provided between the main surface of each of said semiconductor chips and said first press-contact electrode plate, for positioning and fixing each of said semiconductor chips in a horizontal direction.

32. The press-contact type semiconductor device according to claim 22, wherein said first press-contact electrode plate has columnar projecting portions at the positions corresponding to said respective semiconductor chips, and the main surface of each of said semiconductor chips is press-contacted by said projecting portions.

33. A press-contact type semiconductor device comprising:

- a plurality of semiconductor chips solderlessly arranged on the same plane;
- an insulation frame, provided in the main surface of each of said plurality of semiconductor chips, and having openings at positions corresponding to said respective semiconductor chips;
- a disk type heat buffer plate provided on a rear surface of said semiconductor chips; and
- first and second press-contact electrode plates for press-contacting said plurality of semiconductor chips at the same time, wherein said insulation frame and said disk type heat buffer plate sandwich said respective semiconductor chips from upper and lower directions, thereby positioning and fixing said respective semiconductor chips.

34. The press-contact type semiconductor device according to claim 33, wherein said plurality of semiconductor chips include FRD chips arranged at a central portion and IGBT chips arranged to surround said FRD chips, and said respective FRD chips are connected to said respective IGBT chips in parallel such that their current flowing directions are opposite to each other.

35. The press-contact type semiconductor device according to claim 33, further comprising chip frames, provided between the main surface of each of said semiconductor chips and said first press-contact electrode plate, for positioning and fixing each of said semiconductor chips in a horizontal direction.

36. The press-contact type semiconductor device according to claim 33, wherein said first press-contact electrode plate has columnar projecting portions at the positions corresponding to said respective semiconductor chips, and the main surface of each of said semiconductor chips is press-contacted by said projecting portions.

37. The press-contact type semiconductor device according to claim 33, further comprising a ring frame, having an opening corresponding to said second press-contact electrode plate, and engaged with said insulation frame, thereby sandwiching said plurality of semiconductor chips and said disk type heat buffer plate.

* * * * *